United States Patent
Seetharaman et al.

(10) Patent No.: US 6,816,010 B2
(45) Date of Patent: Nov. 9, 2004

(54) TRANSIMPEDANCE AMPLIFIER

(75) Inventors: Shivakumar Seetharaman, Westlake Village, CA (US); Lawrence L. Huang, La Mirada, CA (US); Georgios S. Asmanis, North Hollywood, CA (US); Anders K. Petersen, Carpinteria, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/325,048

(22) Filed: Dec. 20, 2002

(65) Prior Publication Data

US 2004/0119542 A1 Jun. 24, 2004

(51) Int. Cl.[7] .................................................. H03F 1/36
(52) U.S. Cl. ........................ 330/85; 330/277; 330/308; 330/291; 330/110; 375/318; 250/214 R
(58) Field of Search .......................... 330/85, 277, 308, 330/291, 110; 375/318; 250/214 R; 398/202

(56) References Cited

U.S. PATENT DOCUMENTS

| | | | | |
|---|---|---|---|---|
| 4,218,613 A | * | 8/1980 | Bletz | 250/214 A |
| 4,902,982 A | * | 2/1990 | Moore et al. | 330/85 |
| 5,430,766 A | * | 7/1995 | Ota et al. | 375/318 |
| 5,805,558 A | | 9/1998 | Kimura | |
| 5,892,609 A | | 4/1999 | Saruwatari | |
| 6,342,694 B1 | | 1/2002 | Satoh | |
| 6,593,810 B2 | | 7/2003 | Yoon | |

| | | | |
|---|---|---|---|
| 2003/0219260 A1 | * | 11/2003 | Chiou et al. ........ 398/202 |

FOREIGN PATENT DOCUMENTS

JP 411145913 * 5/1999

OTHER PUBLICATIONS

MacLeod On the Bandwidth of Carrier–type DC Amplifiers IEEE Transaction on Circuits and Systems vol. 17, Issue 3, Aug. 1970 pp. 367–371.*
Provisional 60/371,288.*
U.S. patent application, Ser. No. 10/324,999 entitled "Transimpedance Amplifier", Inventor(s) Seetharaman, et al. (Filed Dec. 20, 2002).*
U.S. patent application Ser. No. 10/325,026 entitled "Transimpedance Amplifier", Inventor(s) Seetharaman, et al. (Filed Dec. 20, 2002).*
U.S. patent application Ser. No. 10/324,983 entitled "DC Offset Cancellation Circuit, System and Method", Inventor(s) Seetharaman, et al. (Filed Dec. 20, 2002).*
IEEE Std. 802.3ae—2002, clauses 46, 47 and 51–53.

* cited by examiner

Primary Examiner—Michael B Shingleton
(74) Attorney, Agent, or Firm—Paul G. Nagy

(57) ABSTRACT

Disclosed is a transimpedance amplifier comprising a multistage amplifier and a feedback circuit coupled between a single ended input terminal and one of a plurality of differential output terminals of the multistage amplifier. The feedback circuit may control an input voltage at the single input terminal to substantially maintain a set or predetermined transconductance between the single ended input terminal and the differential output terminals.

37 Claims, 4 Drawing Sheets

TRANSIMPEDANCE AMPLIFIER

The subject matter disclosed herein relates to U.S. patent application Ser. No. 10/074,099, filed on Oct. 11, 2001, U.S. patent application Ser. No. 10/074,397, filed on Feb. 11, 2002, and U.S. patent application Ser. Nos. 10/324,999; 10/325,026 and 10/324,983 filed on Dec. 20, 2002.

BACKGROUND

1. Field

The subject matter disclosed herein relates to data communication systems. In particular, embodiments disclosed herein relate to processing data received from an optical transmission medium.

2. Information

Optical communication networks have been implemented to enable increased data rates in links providing point to point communication. For example, optical communication links are typically implemented in Synchronous Optical Network/Synchronous Digital Hierarchy (SONET/SDH) and 10 Gigabit Ethernet systems. At a receiving end of such an optical communication link, a photodiode may generate a current in response an optical signal received from an optical transmission medium (e.g., fiber optical cabling). A transimpedance amplifier (TIA) typically converts the current generated by the photodiode into a voltage signal that is then processed. For example, the voltage signal may be processed by clock and data recovery circuitry to recover data transmitted in the optical signal.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified.

DETAILED DESCRIPTION

Figure 1:
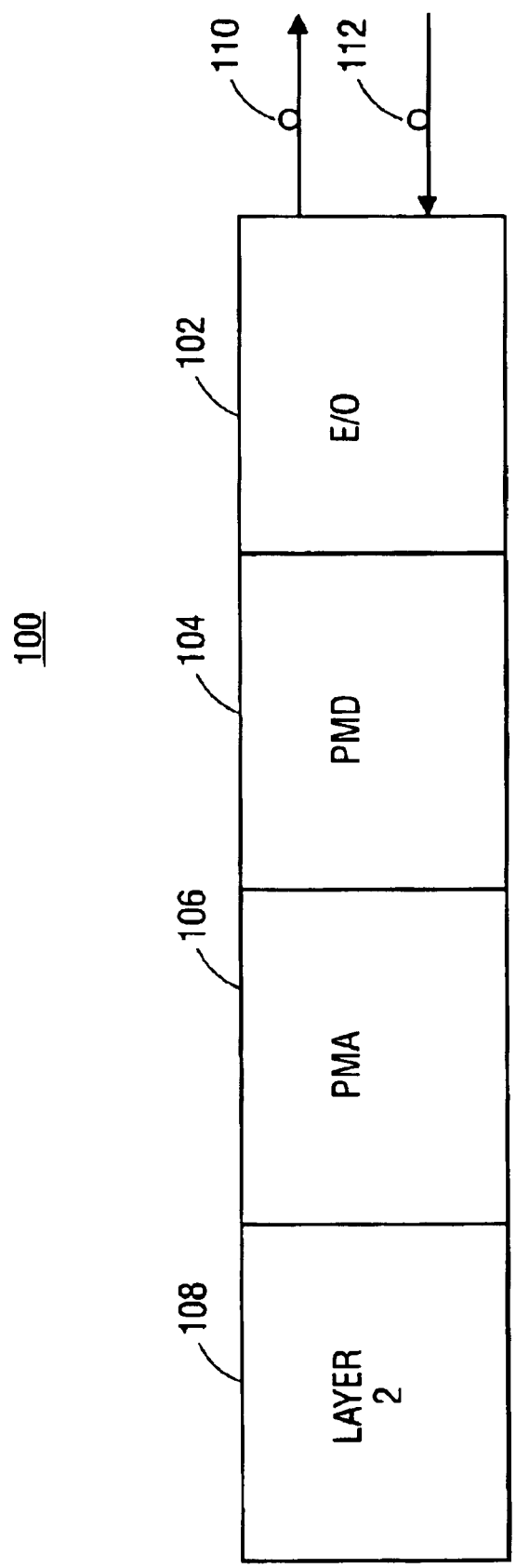
FIG. 1 shows a schematic diagram of a system to transmit data in and receive data from an optical transmission medium according to an embodiment of the present invention.

Reference throughout this specification to one embodiment or an embodiment means that a particular feature, structure, or characteristic described in connection with the embodiment is included in at least one embodiment of the present invention. Thus, the appearances of the phrase in one embodiment or an embodiment in various places throughout this specification are not necessarily all referring to the same embodiment. Furthermore, the particular features, structures, or characteristics may be combined in one or more embodiments.

A photodiode as referred to herein relates to a device that provides an output current in response to light energy collected on a surface. For example, a photodiode may provide an output voltage or an output current in response to charge collected at a photodiode gate. However, this is merely an example of a photodiode and embodiments of the present invention are not limited in these respects.

A transimpedance amplifier (TIA) as referred to herein relates to a device to convert an input current to an output voltage. For example, a TIA may convert an input current received from a photodiode to an output voltage that is substantially proportional to a magnitude of the input current. However, this is merely an example of a TIA and embodiments of the present invention are not limited in this respect.

A multistage amplifier as referred to herein relates to an amplifier having at least one input amplification stage to receive an input signal and one output amplification stage to provide an output signal. For example, a multistage amplifier may comprise a transistor at an input amplification stage to receive an input signal and one or more transistors at an output amplification stage to provide an output signal. However, this is merely an example of a multistage amplifier and embodiments of the present invention are not limited in these respects.

A feedback circuit as referred to herein relates to a circuit that transmits a signal from a first circuit node to a second node. In a circuit providing an output signal in response to an input signal, for example, a feedback circuit may transmit a signal from a first node coupled to an output signal to a second node. However, this is merely an example of a feedback circuit and embodiments of the present invention are not limited in these respects.

A single-ended terminal as referred to herein relates to an electrical terminal to transmit or receive a single-ended signal. For example, single-ended terminal may receive a signal as an input signal. However, this is merely an example of a single-ended terminal and embodiments of the present invention are not limited in this respect.

Differential terminals as referred to herein relates to a pair of terminal that may receive or transmit a differential signal. For example, differential terminals signal may express a signal as a voltage difference between the terminals. However, this is merely an example of differential terminals and embodiments of the present invention are not limited in this respect.

A transconductance as referred to herein relates to a relationship between an input current to an output voltage. For example, a TIA may comprise a transconductance property that determines the magnitude of an output voltage based upon the magnitude of an input current. Also, an amplification stage of a multistage amplifier may comprise a transconductance property that determines the magnitude of an output signal based upon the magnitude of an input signal. However, these are merely examples of a transconductance and embodiments of the present invention are not limited in these respects.

Briefly, an embodiment of the present invention relates to a transimpedance amplifier comprising a multistage amplifier and a feedback circuit coupled between a single ended input terminal and one of a plurality of differential output terminals of the multistage amplifier. The feedback circuit may control an input voltage to the single input terminal to substantially maintain a set or predetermined transconductance between the single ended input terminal and the differential output terminals. However, this is merely an example embodiment and other embodiments of the present invention are not limited in these respects.

FIG. 1 shows a schematic diagram of a system to transmit in and receive data from an optical transmission medium according to an embodiment of the present invention. An optical transceiver 102 may transmit or receive optical signals 110 or 112 in an optical transmission medium such as fiber optic cabling. The optical transceiver 102 may modulate the transmitted signal 110 or demodulate the received signal 112 according to any optical data transmission format such as, for example, wave division multiplexing wavelength division multiplexing (WDM) or multi-amplitude signaling (MAS). For example, a transmitter portion (not shown) of the optical transceiver 102 may employ WDM for transmitting multiple lanes of data in the optical transmission medium.

A physical medium dependent (PMD) section 104 may provide circuitry, such as a TIA (not shown) and/or limiting amplifier (LIA) (not shown), to receive and condition an electrical signal from the optical transceiver 102 in response to the received optical signal 112. The PMD section 104 may also provide to a laser device (not shown) in the optical transceiver 102 power from a laser driver circuit (not shown) for transmitting an optical signal. A physical medium attachment (PMA) section 106 may include clock and data recovery circuitry (not shown) and de-multiplexing circuitry (not shown) to recover data from a conditioned signal received from the PMD section 104. The PMA section 106 may also comprise multiplexing circuitry (not shown) for transmitting data to the PMD section 104 in data lanes, and a serializer/deserializer (Serdes) for serializing a parallel data signal from a layer 2 section 108 and providing a parallel data signal to the layer 2 section 108 based upon a serial data signal provided by the clock and data recovery circuitry.

According to an embodiment, the layer 2 section 108 may comprise a media access control (MAC) device coupled to the PMA section 106 at a media independent interface (MII) as defined IEEE Std. 802.3ae-2002, clause 46. In other embodiments, the layer 2 section 108 may comprise forward error correction logic and a framer to transmit and receive data according to a version of the Synchronous Optical Network/Synchronous Digital Hierarchy (SONET/SDH) standard published by the International Telecommunications Union (ITU). However, these are merely examples of layer 2 devices that may provide a parallel data signal for transmission on an optical transmission medium, and embodiments of the present invention are not limited in these respects.

The layer 2 section 108 may also be coupled to any of several input/output (I/O) systems (not shown) for communication with other devices on a processing platform. Such an I/O system may include, for example, a multiplexed data bus coupled to a processing system or a multi-port switch fabric. The layer 2 section 108 may also be coupled to a multi-port switch fabric through a packet classification device. However, these are merely examples of an I/O system which may be coupled to a layer 2 device and embodiments of the present invention are not limited in these respects.

The layer 2 device 108 may also be coupled to the PMA section 106 by a backplane interface (not shown) over a printed circuit board. Such a backplane interface may comprise devices providing a 10 Gigabit Ethernet Attachment Unit Interface (XAUI) as provided in IEEE P.802.3ae, clause 47. In other embodiments, such a backplane interface may comprise any one of several versions of the System Packet Interface (SPI) as defined by the Optical Internetworking Forum (OIF). However, these are merely examples of a backplane interface to couple a layer 2 device to a PMA section and embodiments of the present invention are not limited in these respects.

Figure 2:
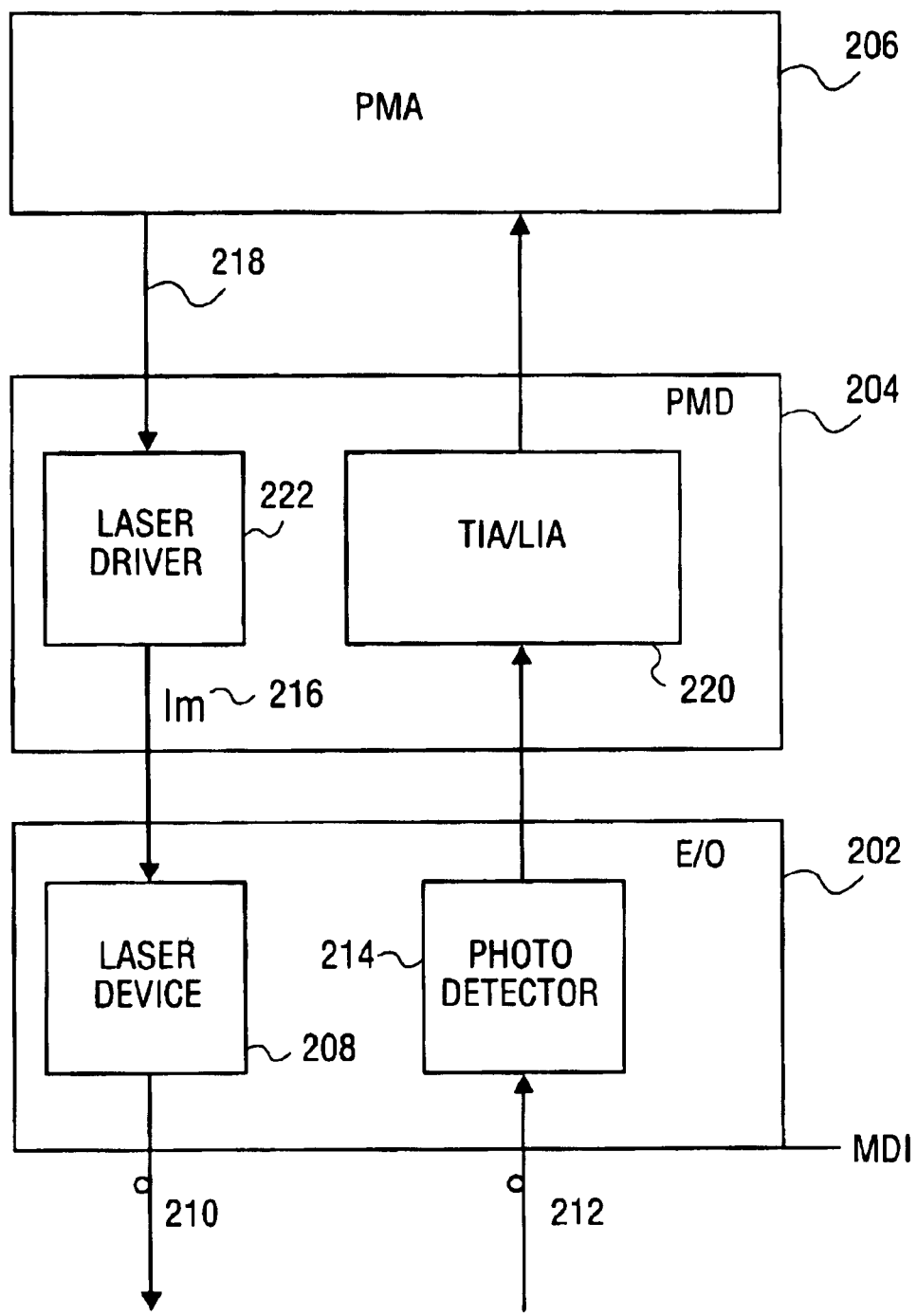
FIG. 2 shows a schematic diagram of physical medium attachment (PMA) and physical medium dependent (PMD) sections of a data transmission system according to an embodiment of the system shown in FIG. 2.

FIG. 2 shows a schematic diagram of a system 200 to transmit data in and receive data from an optical transmission medium according to an embodiment of the system shown in FIG. 2. An optical transceiver 202 comprises a laser device 208 to transmit an optical signal 210 in an optical transmission medium and a photo detector section 214 to receive an optical signal 212 from the optical transmission medium. The photo detector section 214 may comprise one or more photodiodes (not shown) for converting the received optical signal 212 to one or more electrical signals to be provided to a TIA/LIA circuit 220. A laser driver circuit 222 may modulate a modulation current 216 in response to a data signal from a PMA section 206. A laser device 208 may then modulate and power the transmitted optical signal 210 in response to the modulation current 216.

Figure 3:
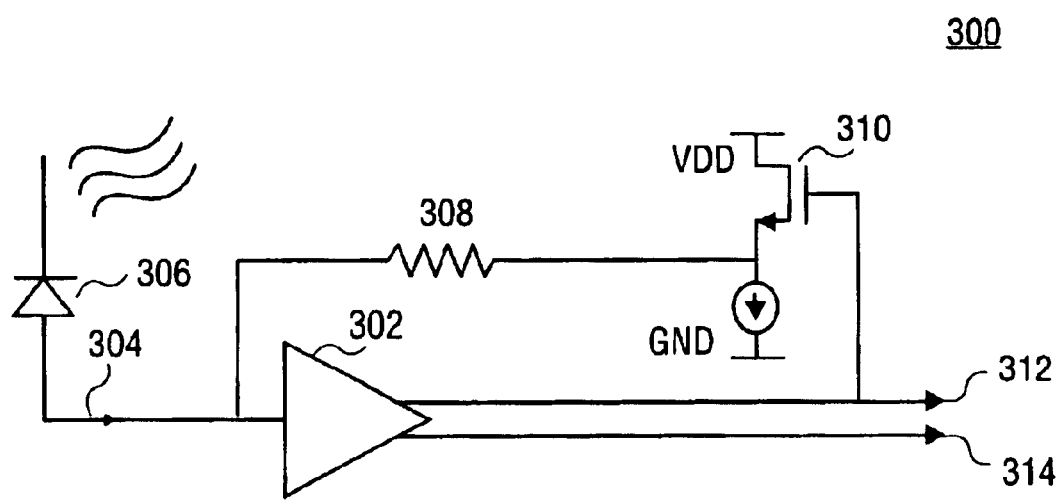
FIG. 3 shows a schematic diagram of a transimpedance amplifier (TIA) according to an embodiment of the PMD section shown in FIG. 2.

FIG. 3 shows a schematic diagram of a TIA 300 according to an embodiment of the PMD section shown in FIG. 2. An amplifier 302 receives a single-ended input 304 from a photodiode 306 which is responsive to an optical data signal and provides a differential output at output terminals 312 and 314. The TIA 300 may be formed as part of an integrated device (e.g., as part of a single device including the TIA 300 and other portions of the PMD section) in a semiconductor process such as a complementary metal oxide semiconductor (CMOS) manufacturing process. However, this is merely an example of a process that may be used to form a TIA and embodiments of the present invention are not limited in this respect.

The amplifier 302 may comprise a multistage amplifier. According to an embodiment, the output terminal 312 provides feed back signal to a source follower circuit at a gate of a transistor 310. In response to the feed back signal, the transistor 310 may then provide an output signal to the single ended input 304 through a resistor 308.

Figure 4:
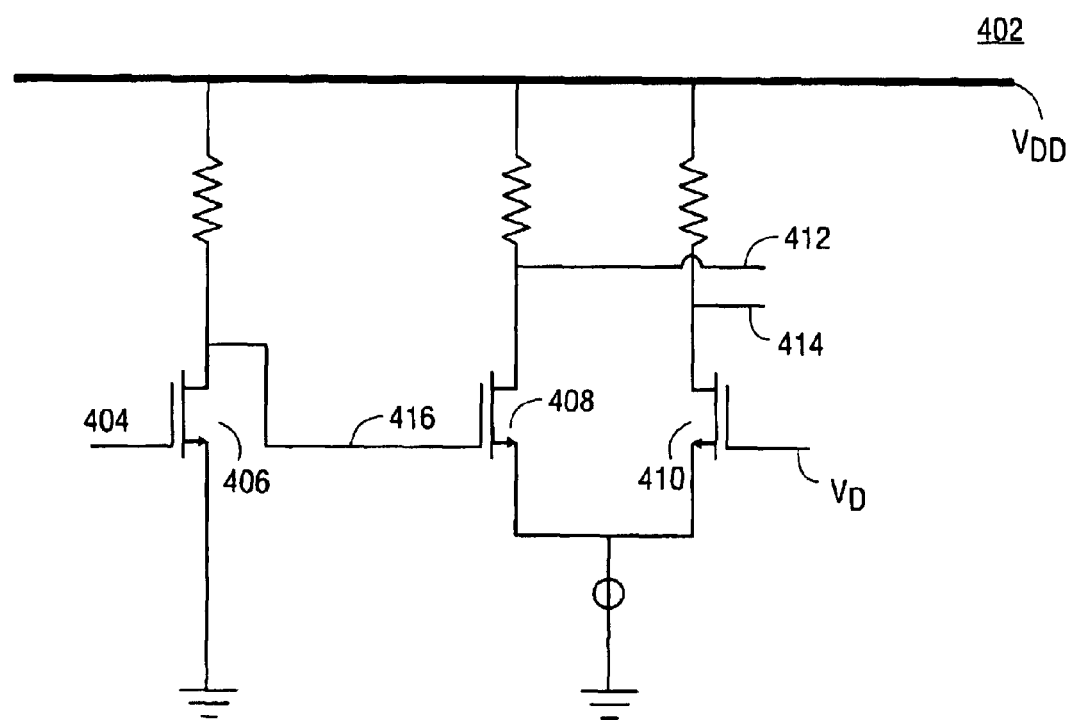
FIG. 4 shows a schematic diagram of a multistage amplifier according to an embodiment of the TIA shown in FIG. 3.

FIG. 4 shows a schematic diagram of an amplifier 400 according to an embodiment of the amplifier 302 shown in FIG. 3. A first amplification stage comprises a transistor 406. A gate of the transistor 406 may receive a single ended input signal on a single-ended input terminal 404 from the photodiode 306. In response to the input signal, a second amplification stage comprising a differential amplifier formed by transistors 408 and 410 may provide an output voltage on differential output terminals 412 and 414. However, this is merely an example of a multistage amplifier that may be implemented in a TIA and embodiments of the present invention are not limited in this respect.

According to an embodiment, the photodiode 306 may comprise an inherent capacitance resulting in a capacitive output impedance ($Z_{out}$) while the transistor 406 may comprise an inherent capacitance resulting in a capacitive input impedance ($Z_{in}$). According to an embodiment, noise added to the single ended input 304 from the first amplification stage at transistor 406 may be reduced by substantially matching the impedances $Z_{in}$ and $Z_{out}$. The input capacitance of the first amplification stage may be modeled as a function of transistor gate length (L) of the transistor 406 and the width of the input (W) of the transistor 406 as follows:

$$Z_{in} \alpha W \times L$$

According to an embodiment, the transistor gate length L of transistor 406 may be fixed and predetermined based upon a particular process technology being used to form the TIA 300 (e.g., any one of several CMOS processing technologies) while the input width W may be varied according to a specific design using techniques known to those of ordinary skill in the are of CMOS circuit design. For example, W may be chosen to substantially match $Z_{in}$ and $Z_{out}$ to reduce noise being added by the first amplification stage.

According to an embodiment, the TIA 300 may be designed to provide a set or predetermined transconductance coupling the single ended input 304 to the differential output terminals 312 and 314. This set or predetermined transconductance of TIA 300 may be modeled as the product of the individual tranconductances of each stage of amplifier 302 including a transconductance $g_m$ of a first amplification stage (e.g., at transistor 406). Thus, this set or predetermined transconductance of TIA 300 may be controlled, at least in part, by controlling the transconductance $g_m$ of the first amplification stage. According to an embodiment, the transconductance $g_m$ of the first amplification stage of the amplifier 402 may be modeled as a function of the voltage of the single ended input 304 ($V_{in}$) as follows:

$g_m \alpha W/L \times V_{in}$

By setting the width W of the input to transistor 406 to substantially match impedances $Z_{in}$ and $Z_{out}$, the transconductance of the TIA 300 may be controlled by controlling $V_{in}$. The last stage of the amplifier 402 may provide an output voltage $V_{out}$ that is provided from terminal 312 to the gate of source follower transistor 310. $V_{out}$ may be set by sizing the last amplification stage of the amplifier 400 to satisfy a signal input requirement to other processing such as a LIA circuit, or clock and data recovery circuitry in a PMA section (not shown). Accordingly, the size of the transistor 310, voltage $V_{DD}$ and resistance of resistor 308 may be chosen to control $V_{in}$ as a function of $V_{out}$ using techniques known to those of ordinary skill in the art of analog circuit design.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A transimpedance amplifier comprising:
a multistage amplifier comprising differential output terminals to provide an output signal in response to an input signal and an input stage transistor having a gate terminal to receive the input signal from a photodiode; and
a feedback transistor comprising a gate terminal coupled to one of the differential output terminals, and one of a source terminal and a drain terminal coupled to the gate terminal of the input stage transistor, wherein the feedback transistor is selected to maintain an input voltage at the gate terminal of the input stage transistor to maintain a set or predetermined transconductance between the gate terminal of the input stage transistor and the differential output terminals.

2. The transimpedance amplifier of claim 1, wherein the multistage amplifier comprises an input impedance substantially matching an impedance of the photodiode.

3. A transimpedance amplifier comprising:
a multistage amplifier comprising differential output terminals and a single ended input terminal to receive an input signal from a photodiode;
a transistor comprising a gate terminal coupled to one of the differential output terminals, and one of a source terminal and a drain terminal coupled to the single ended input terminal; and
resistor coupled between the single ended input terminal and the one of a source terminal and drain terminal of the, and wherein the resistor comprises a resistance selected to maintain an input voltage at the single ended input to maintain a set or predetermined transconductance between the single ended input terminal and the differential output terminals.

4. A transimpedance amplifier comprising:
a multistage amplifier comprising differential output terminals to provide an output signal in response to an input signal and an input stage transistor having a gate terminal to receive the input signal from a photodiode; and
a feedback circuit coupled between the gate terminal of the input stage transistor and a differential output terminal to maintain an input voltage at the gate terminal of the input transistor to substantially maintain a set or predetermined transconductance between the gate terminal of the input stage transistor and the differential output terminals.

5. The transimpedance amplifier of claim 4, wherein the input transistor comprises a capacitive input impedance that is substantially proportional to an input width of the input transistor.

6. The transimpedance amplifier of claim 5, wherein the input transistor comprises a transconductance that is substantially proportional to the input width.

7. The transimpedance amplifier of claim 4, wherein the feedback circuit comprises a source follower circuit.

8. The transimpedance amplifier of claim 5, wherein the transimpedance amplifier is formed in a complementary metal oxide semiconductor device.

9. A system comprising:
a photodiode;
a transimpedance amplifier coupled to the photodiode to provide a differential output signal;
a data recovery circuit to provide a serial data signal in response to the differential output signal;
a deserializer to provide a parallel data signal in response to the serial data signal, wherein the transimpedance amplifier comprises:
a multistage amplifier comprising differential output terminals to provide the differential output signal in response to an input signal and an input stage transistor having a gate terminal to receive the input signal from the photodiode; and
a feedback transistor comprising a gate terminal coupled to one of the differential output terminals, and one of a source terminal and a drain terminal coupled to the gate terminal of the input stage transistor, wherein the feedback transistor is selected to maintain an input voltage at the gate terminal of the input stage transistor to maintain a set or predetermined transconductance between the gate terminal of the input stage transistor and the differential output terminals.

10. The system of claim 9, the system further comprising a SONET framer to receive the parallel data signal.

11. The system of claim 10, wherein the system further comprises a switch fabric coupled to the SONET framer.

12. The system of claim 9, the system further comprising an Ethernet MAC to receive the parallel data signal at a media independent interface.

13. The system of claim 12, wherein the system further comprises a multiplexed data bus coupled to the Ethernet MAC.

14. The system of claim 12, wherein the system further comprises a switch fabric coupled to the Ethernet MAC.

15. The system of claim 9, wherein the multistage amplifier comprises an input impedance substantially matching an impedance of the photodiode.

16. A system comprising:
a photodiode;
a transimpedance amplifier coupled to the photodiode to provide a differential output signal;
a data recovery circuit to provide a serial data signal in response to the differential output signal;
a deserializer to provide a parallel data signal in response to the serial data signal, wherein the transimpedance amplifier comprises:
a multistage amplifier comprising a single ended input terminal to receive an input signal from the photodiode and differential output terminals to provide the differential output signal;
a transistor comprising a gate terminal coupled to one of the differential output terminals, and one of a source terminal and a drain terminal coupled to the single ended input terminal; and
a resistor coupled between the single ended input terminal and the one of a source terminal and drain terminal of the transistor, and wherein the resistor comprises a resistance selected to maintain an input voltage at the single ended input to maintain a set or predetermined transconductance between the single ended input terminal and the differential output terminals.

17. A system comprising:
a photodiode;
a transimpedance amplifier coupled to the photodiode to provide a differential output signal;
a data recovery circuit to provide a serial data signal in response to the differential output signal; and
a deserializer to provide a parallel data signal in response to the serial data signal, wherein the transimpedance amplifier comprises:
a multistage amplifier comprising differential output terminals to provide an output signal in response to an input signal and an input stage transistor having a gate terminal to receive the input signal from the photodiode; and
a feedback circuit coupled between the gate terminal of the input stage transistor and a differential output terminal to maintain an input voltage at the gate terminal of the input stage transistor to substantially maintain a set or predetermined transconductance between the gate terminal of the input stage transistor and the differential output terminals.

18. The system of claim 17, the system further comprising a SONET framer to provide the parallel data signal.

19. The system of claim 18, wherein the system further comprises a switch fabric coupled to the SONET framer.

20. The system of claim 17, the system further comprising an Ethernet MAC to provide the parallel data signal at a media independent interface.

21. The system of claim 20, wherein the system further comprises a multiplexed data bus coupled to the Ethernet MAC.

22. The system of claim 20, wherein the system further comprises a switch fabric coupled to the Ethernet MAC.

23. The system of claim 17, wherein the input impedance comprises a capacitive impedance that is substantially proportional to an input width of an input transistor of the multistage amplifier.

24. The system of claim 23, wherein the input transistor comprises a transconductance that is substantially proportional to the input width.

25. The system of claim 17, wherein the feedback circuit comprises a source follower circuit.

26. A method comprising:
receiving an input signal from a photodiode at a gate terminal of an input stage transistor of a multistage amplifier;
providing a voltage of a pair of differential output terminals of the multistage amplifier to a gate terminal of a feedback transistor; and
providing to the gate terminal of the input stage transistor a current from one of a source terminal and a drain terminal of the feedback transistor, wherein the feedback transistor is selected to maintain an input voltage at the gate terminal of the input stage transistor to maintain a set or predetermined transconductance between the gate terminal of the input stage transistor and the differential output terminals.

27. The method of claim 26, wherein the multistage amplifier comprises an input impedance substantially matching an impedance of the photodiode.

28. A method comprising:
receiving an input signal from a photodiode at a single ended input terminal of a multistage amplifier;
providing a voltage of a pair of differential output terminals of the multistage amplifier to a gate terminal of a transistor;
providing to the single ended input terminal a current from one of a source terminal and a drain terminal of the transistor; and
coupling a resistance between the transistor and the single ended input terminal to maintain an input voltage at the single ended input to maintain a set or predetermined transconductance between the single ended input terminal and the differential output terminals.

29. A method comprising:
receiving an input signal from a photodiode at a gate terminal of an input stage transistor of a multistage amplifier; and
maintaining an input voltage at the single ended input terminal to substantially maintain a set or predetermined transconductance between the gate terminal of the input stage amplifier and the differential output terminals in response to a voltage at one of the differential output terminals.

30. The method of claim 29, wherein the input stage transistor comprises a capacitive input impedance that is substantially proportional to an input width of the input stage transistor of the multistage amplifier, and wherein the method further comprises substantially matching the capacitive input impedance with an impedance of the photodiode.

31. The method of claim 30, wherein the input stage transistor comprises a transconductance that is substantially proportional to the input width.

32. The system of claim 16, the system further comprising a SONET framer to receive the parallel data signal.

33. The system of claim 32, wherein the system further comprises a switch fabric coupled to the SONET framer.

34. The system of claim 16, the system further comprising an Ethernet MAC to receive the parallel data signal at a media independent interface.

35. The system of claim 34, wherein the system further comprises a multiplexed data bus coupled to the Ethernet MAC.

36. The system of claim 34, wherein the system further comprises a switch fabric coupled to the Ethernet MAC.

37. The system of claim 16, wherein the multistage amplifier comprises an input impedance substantially matching an impedance of the photodiode.

* * * * *